(12) United States Patent
Makita et al.

(10) Patent No.: US 6,633,115 B1
(45) Date of Patent: Oct. 14, 2003

(54) SHADOW MASK

(75) Inventors: Akira Makita, Tokyo-to (JP); Yutaka Matsumoto, Tokyo-to (JP); Takahito Aoki, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 256 days.

(21) Appl. No.: 09/698,340

(22) Filed: Oct. 27, 2000

(30) Foreign Application Priority Data

Oct. 29, 1999 (JP) .............................. 11-310065
Sep. 18, 2000 (JP) ............................... 2000-281588

(51) Int. Cl.[7] ............................................... H01J 29/80
(52) U.S. Cl. ...................... 313/402; 313/407; 313/408
(58) Field of Search ................... 313/402, 407, 313/408; 148/310, 311

(56) References Cited

U.S. PATENT DOCUMENTS

| | | | | |
|---|---|---|---|---|
| 4,846,747 A | * | 7/1989 | Higashinakagawa et al. | 445/47 |
| 5,308,723 A | * | 5/1994 | Inoue et al. | 430/23 |
| 5,396,146 A | * | 3/1995 | Nakamura et al. | 313/402 |
| 5,620,535 A | * | 4/1997 | Inoue et al. | 148/311 |
| 5,811,918 A | * | 9/1998 | Van Den Berg et al. | 313/402 |
| 6,229,255 B1 | * | 5/2001 | Kim et al. | 313/402 |
| 6,356,010 B1 | * | 3/2002 | Nakamura | 313/402 |
| 6,512,324 B1 | * | 1/2003 | Makita et al. | 313/402 |

* cited by examiner

Primary Examiner—Robert H. Kim
Assistant Examiner—Jurie Yun
(74) Attorney, Agent, or Firm—Timothy J. Keefer; Wildman, Harrold, Allen & Dixon

(57) ABSTRACT

A shadow mask comprises a frame member, a mask body formed in a plate shape as a grid element and mounted to the frame member and a plurality of slits formed to the mask body. The mask body is composed of an iron-based alloy containing 31.0–38.0 weight % of nickel and 1.0–6.5 weight % of cobalt and the iron-based alloy contains 0.01–0.10 weight % of carbon.

1 Claim, 2 Drawing Sheets

SHADOW MASK

CROSS REFERENCE TO RELATED APPLICATION

This application claims the priority of Japanese patent application Serial No. 11-310065 filed on Oct. 29, 1999 and Japanese patent application Serial No. 2000-281588 filed on Sep. 18, 2000.

BACKGROUND OF THE INVENTION

1. Field of The Invention

The present invention relates to a shadow mask to be used for color Braun tubes (cathode ray tubes) such as color television display, computer display or the like, and more particularly, to an extension type shadow mask which can be suitably used for an aperture-grill type color Braun tube.

2. Related Prior Art

Conventionally, a shadow mask has been used for color Braun tubes such as color television display, computer display or the like. The shadow mask is disposed to a predetermined portion in the color Braun tube and is formed with opening (aperture) portions through which electron beam is radiated to a fluorescent surface (phosphor layer) formed to an inner surface of the Braun tube.

The shadow mask takes various structures as the opening portion such as:

(a) a structure that a number of small and round holes are formed;

(b) a structure that a number of small holes each having a rectangular-shape are formed;

(c) a structure that a number of slits are provided so as to align with each other.

The shadow masks formed with the opening portions having structures specified in (a) and (b) are hereinlater referred to as "press-type shadow mask" for the sake of convenience, which is usually manufactured by a press-forming method. On the other hand, the shadow mask formed with the opening portion having a structure specified in (c) is hereinlater referred to as expansion-type shadow mask" for the sake of convenience, which is generally called an aperture grill. The expansion-type shadow mask is usually manufactured by fixing a mask body to a rigid steel frame while the slits are expanded in a longitudinal direction thereof so as not to cause a disturbance in slit interval, i.e. so as to have a uniform interval therebetween.

In the Braun tube provided with such shadow mask, a part of electron beams radiated from an electron gun collides with a surface of the shadow mask without passing through the small holes or the slits. Therefore, the shadow mask is heated by the collision of the electron beams.

In this regard, since the conventional shadow mask is formed of a low-carbon steel plate having a large thermal expansion coefficient, the shadow mask is liable to cause thermal expansion due to the heat generation based on the collision of the electron beams, causing phenomena such that the small holes are displaced in positions and deformed, and slacks are arisen at the slit portions thereby to cause the disturbance in slit interval. Such phenomena leads to the displacement of the electron beams reaching the fluorescent surface inside the Braun tube, so that there has been posed a problem of causing a color mismatching to an image reproduced on the Braun tube.

Further, in the prior art, on the assumption that a metal material (element) to be formed into the expansion-type shadow mask will be thermally expanded, an expanding/fixing working has been performed to the conventional shadow mask by applying a high tensile force to the shadow mask so as not to cause a slack at the slit portions even if the thermal expansion be caused. In a case where the fixing working is performed by applying such high tensile force, the shadow mask is required to be formed from a material having strength capable of enduring the high tensile force. Furthermore, it is also required for the steel frame to be increased in its structural strength.

To cope with these problems, from the viewpoint of suppressing the thermal expansion of the metal material, it has been reviewed and tried to use a metal material having a small thermal expansion coefficient. For example, some of the shadow masks have been formed by using iron-nickel alloy or iron-nickel-cobalt alloy. Such shadow masks have an advantage of that the thermal expansion hardly occurs even if the heat generation is took place by the collision of the electron beams.

However, inherently, the iron-nickel alloy and the iron-nickel-cobalt alloy have not a sufficient mechanical strength. Therefore, when such the metal materials are specifically applied to the expansion-type shadow mask, there may be caused a fear that the materials cannot endure the expanding/fixing working performed under using the high tensile force.

Furthermore, the expansion-type shadow mask is formed from a thin metal material having a small thickness in comparison with the press-type shadow mask which is manufactured through a press-forming so as to maintain the shape coincident with a curved surface of the Braun tube. Therefore, the problems described hereinbefore had become more remarkable.

SUMMARY OF THE INVENTION

An object of the present invention is to substantially eliminate defects or drawbacks encountered in the prior art mentioned above and to provide a shadow mask, specifically, an expansion-type shadow mask, capable of being suitably applied to an aperture-grill type color Braun tube, suppressing thermal expansion and sufficiently enduring the expanding/fixing working to be performed under a high tensile force being applied.

This and other object can be achieved according to the present invention by providing a shadow mask, specifically, an expansion-type shadow mask, composed of an iron-based alloy containing 31.0–38.0 weight % of nickel and 1.0–6.5 weight % of cobalt, wherein the iron-based alloy contains 0.01–0.10 weight % of carbon.

According to the present invention of the characters mentioned above, since the iron-based alloy containing 31.0–38.0 weight % of nickel and 1.0–6.5 weight % of cobalt has a small thermal expansion coefficient, the expansion-type shadow mask manufactured by using such a metal material hardly cause a thermal expansion even if the heat is generated through the collision of the electron beam. As a result, the thus manufactured expansion-type shadow mask hardly cause a slack at the slit portions due to the thermal expansion and hardly cause any disturbance of slit-interval, so that the shadow mask is no need to be expanded and fixed by being applied with an excessively high tensile force at the assembling process for the shadow mask, and also, the strength of the steel frame is no need to be increased.

In addition, the iron-based alloy contains 0.01–0.10 weight % of carbon, so that a tensile strength of the alloy can be increased in comparison with an iron-based alloy containing no carbon. Therefore, on the assumption that a certain amount of thermal expansion is caused in the manufacturing process of the expansion type shadow mask, and even if the thermal expansion is actually caused slightly, it becomes possible to perform the expanding and fixing working by applying a high tensile force of a level without causing any slacks at the slit portions.

As a result, the expansion-type shadow mask of the present invention would not pose a fear of causing disturbance of the slits provided in a Braun tube and the displacement of the electron beam on the fluorescent surface formed in the Braun tube would not occur, so that a color-mismatching is not caused in a reproduced image on the Braun tube.

In another aspect of the present invention, it is preferable that the iron-based alloy used in the above expansion-type shadow mask has a tensile strength of 650 N/mm$^2$ or more and 1000 N/mm$^2$ or less.

According to the invention of this aspect, the iron-based alloy has a tensile strength of 650 N/mm$^2$ or more and 1000 N/mm$^2$ or less, so that the expanding/fixing operation for the shadow mask can be easily and appropriately performed by applying a high tensile force at the manufacturing process of the expansion-type shadow mask. As a result, even if the thermal expansion slightly occurs due to the heat generation caused by the collision of the electron beam, the slacks would not occur at the slit portions of the thus obtained expansion-type shadow mask, so that the disturbance of the slit-interval can be effectively prevented.

More in detail, the above-mentioned object of the present invention can be achieved by providing a shadow mask particularly of an expansion type comprising:

a frame member;

a mask body formed in a plate shape as a grid element and mounted to the frame member; and a plurality of slits formed to the mask body, wherein the mask body is composed of an iron-based alloy containing 31.0–38.0 weight % of nickel and 1.0–6.5 weight % of cobalt, the iron-based alloy containing 0.01–0.10 weight % of carbon.

The nature and further characteristic features of the present invention will be made more clear from the following descriptions made with reference to the accompanying drawings.

DESCRIPTION OF THE PREFERRED EMBODIMENTS

Preferred embodiments of the expansion-type shadow mask according to the present invention will be described hereunder with reference to the accompanying drawings. Further, it is to be noted that the unit symbol "%" used herein means "weight %", even if it is not specifically mentioned, which is equivalently used as "mass %".

Figure 1:
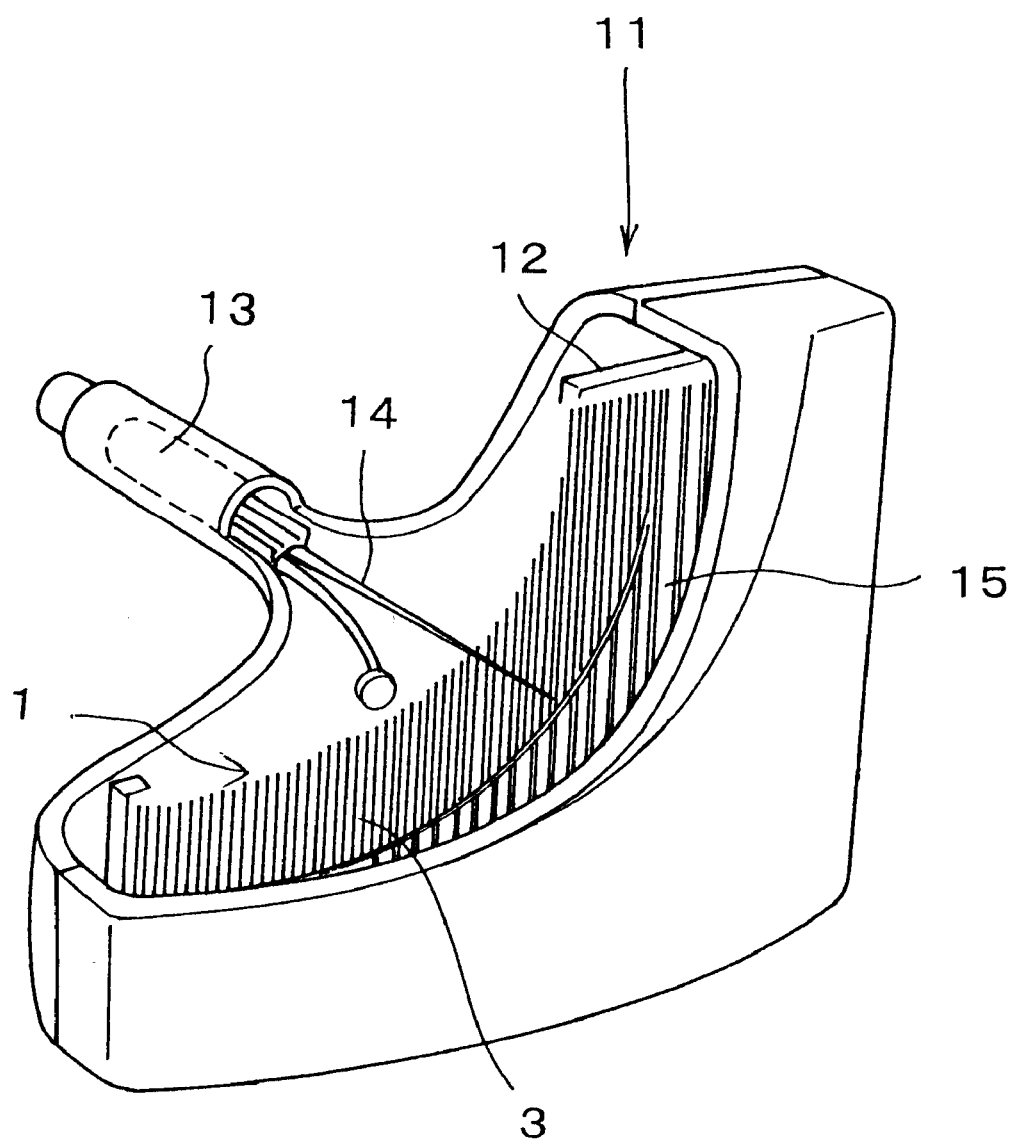
FIG. 1 is a perspective view showing one embodiment of an expansion-type shadow mask according to the present invention which is applied to a color Braun tube.
Figure 2A:
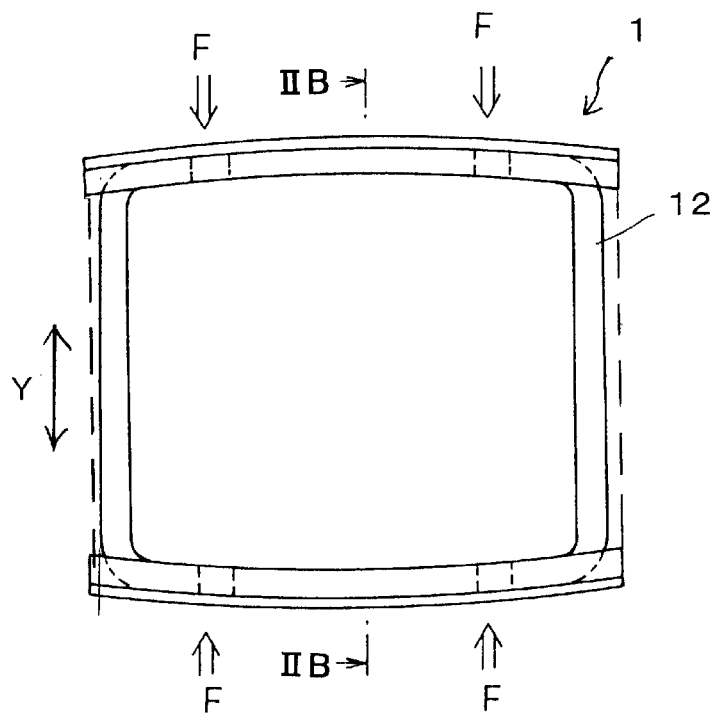
FIG. 2A is an illustration of a front view showing one embodiment of an expansion-type shadow mask according to the present invention which is manufactured by being expanded and fixed to a steel frame.
Figure 2B:
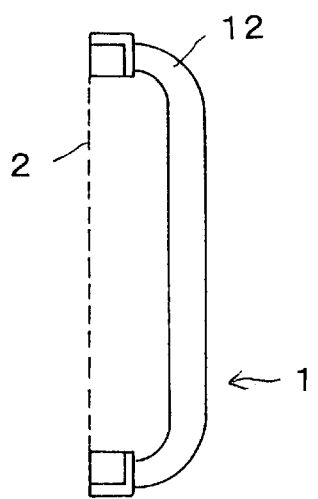
FIG. 2B is a cross sectional view taken along the line IIB—IIB of FIG. 2A.

With reference to FIGS. 1 and 2, a shadow mask 1, which is of an expansion-type one of the present invention, is composed of an iron-based alloy containing 31.0–38.0 weight % of nickel and 1.0–6.5 weight % of cobalt. The iron-based alloy contains 0.01–0.10 weight % of carbon. When the expansion-type shadow mask is manufactured by using this iron-based alloy, it is preferred for the iron-based alloy to have a tensile strength of 650 N/mm$^2$ or more and 1000 N/mm$^2$ or less.

The iron-based alloy at least including the components mentioned above is a metal material having a low thermal expansion coefficient of about $4.0 \times 10^{-6}/°$ C. Further, when an optimum thermal expansion coefficient is taken into consideration, more preferable composition ranges of the components are 32.0–34.0% of nickel and 3.5–6.5% of cobalt.

When the nickel content is less than 31.0% or exceeds 38.0%, the thermal expansion is liable to be caused by the heat generation based on the collision of the electron beam, so that there may be posed a fear that a slack is formed at the slit portions of the expansion-type shadow mask to thereby raise a disturbance of the slit-interval.

In addition, when the cobalt content is less than 1.0% or exceeds 6.5%, as the same as above, the thermal expansion is liable to be caused by the heat generation based on the collision of the electron beam, so that there may also be posed a fear that the slack is formed at the slit portions of the expansion-type shadow mask to thereby raise the disturbance of the slit-interval.

When 0.01% or more and 0.10% or less of carbon is added to this iron-based alloy, the strength of the alloy is increased. Further, when the strength and etching property of the raw material are taken into consideration, the more preferable lower limit of the carbon content is 0.02% and the more preferable upper limit of the carbon content is 0.07% and, more preferably, it may be set to 0.06%.

The iron-based alloy containing carbon at an amount within the above range has a sufficient strength enough to endure the expanding/fixing working that are usually performed at the manufacturing process of the expansion-type shadow mask. In addition, even if a certain extent of thermal expansion be caused at the expansion-type shadow mask mounted to inside the Braun tube, the iron-based alloy has a sufficient strength enough to endure the expanding/fixing working that are usually performed by applying a high tensile force of a level without causing any slacks at the slit portions.

When the carbon content is less than 0.01%, the tensile strength of the iron-based alloy is somewhat insufficient, so that there may be a case where the shadow mask composed of the iron-based alloy cannot endure the expanding/fixing working that are performed by applying a high tensile force of a level without causing any slack at the slit portions even if the thermal expansion is slightly caused to the expansion-type shadow mask.

On the other hand, when the carbon content exceeds 0.10%, there reveal a tendency that carbonate type inclusions are disadvantageously increased, so that an etching property utilized in the manufacturing process of the expansion-type shadow mask is liable to be deteriorated and obstructed. As a result, it is liable for the thus obtained expansion-type shadow mask to cause a scattering in the width direction of the slit. Therefore, when such the expansion-type shadow mask is mounted to the Braun tube, non-uniformity or unevenness may be caused on the fluorescent surface of the Braun tube.

The reason why the upper limit of the carbon content is set to 0.07%, more preferably to 0.06% is that the above non-uniformity or unevenness hardly reveals on a display of the Braun tube even if the shadow mask is formed as a product having a transmission ratio of 19.0% to which a higher grade of quality is technically demanded.

In this connection, the above "transmission ratio" is a value (opening or aperture ratio) indicating a ratio (%) of a total opening area of the actually formed slits with respect to an area having a predetermined range in which a number of slits are formed.

Although there is a case where the strength of the iron-based alloy varies in accordance with the working treatment conditions for the iron-based alloy, it is preferable for the iron-based alloy used in the above expansion-type shadow mask to have a tensile strength of 650 N/mm² or more and 1000 N/mm² or less, and a range 750 N/mm² or more and 900 N/mm², or less is particularly preferable. When the tensile strength is less than 650 N/mm², there may cause a case that the iron-based alloy cannot endure the expanding/fixing working with the high tensile force mentioned hereinbefore.

On the other hand, when the tensile strength exceeds 1000 N/mm², there may cause a case that the iron-based alloy is hardened and it becomes difficult to uniformly finish the iron-based alloy so as to have a predetermined plate-shape at a cold-rolling process. In this connection, the strength of the iron-based alloy can be set to and controlled within the above predetermined range by optimally combining various conditions such as a reduction ratio in the cold-rolling process, an annealing temperature and a time at the annealing process or the like that is suitably controlled in the manufacturing process of the expansion-type shadow mask as described hereinlater.

In the present invention, the iron-based alloy having a small thermal expansion coefficient and a sufficient tensile strength is used for forming the shadow mask, so that the shadow mask is no need to be expanded and fixed by being applied with an excessively high tensile force at the assembling process for the shadow mask.

In addition, even if the thermal expansion is actually caused slightly, it becomes possible to perform the expanding and fixing operation by applying a high tensile force of a level without causing any slacks at the slit portions.

As a result, the expansion-type shadow mask of the present invention would not pose a fear of causing disturbance of the slits provided in a Braun tube and the displacement of the electron beam to be attained to the fluorescent surface formed in the Braun tube would not occur, so that a color-mismatching is not caused in a reproduced image on the Braun tube.

Furthermore, since the expansion-type shadow mask of the present invention is manufactured from the iron-based alloy having a small thermal expansion coefficient and a high tensile strength, it becomes possible to decrease a thickness of the alloy plate with decreasing amount of about 10–30% in comparison with the conventional shadow mask composed of a low-carbon steel.

When the thickness of the expansion-type shadow mask is decreased, there can be obtained an advantage of decreasing a total weight of a frame (steel frame) retaining the shadow mask in the Braun tube. In addition, the iron-based alloy to be used for the expansion-type shadow mask of the present invention has a magnetic property enough to exhibit a sufficient magnetic shielding effect, so that the iron-based alloy can be suitably used as a material constituting the expansion-type shadow mask for Braun tube.

The expansion-type shadow mask of the present invention is manufactured as follows.

At first, metal materials are blended so as to have a predetermined composition for an iron-based alloy, the blended materials are melted and solidified to thereby prepare a steel ingot. Then, the steel ingot is rolled to obtain a plate having a predetermined thickness in accordance with a hot-forging method or hot-rolling method. Thereafter, the plate is further subjected to the cold-rolling and annealing processes or the like process, thus preparing a plate member having a thickness of about 0.02–0.30mm. The thus obtained plate member is then subjected to an etching treatment so as to form a plate member for the expansion-type shadow mask. In other words, the metal member is worked to form a grid element or material composed of the iron-based alloy.

In this regard, the above etching treatment is a method comprising the steps of: coating a photo-resist to the plate member and drying the coated resist; thereafter exposing the resist using a mask having a predetermined slit pattern so as to form a masked portions and non-masked portions; and etching-treating and melting the non-masked portions so as to form a grid element 2 having a predetermined slit pattern.

As shown in FIG. 2A, the thus obtained grid element 2 (indicated by an imaginary dotted line in FIG. 2), which is the plate member for the expansion-type shadow mask, is welded and fixed to a steel frame 12 at upper and lower portions thereof under a state where the steel frame 12 is applied with pressing force in a direction F reverse to an expanding direction Y. Thereafter, the pressing force is released and a high tensile force is imparted to the grid element 2 by the action of a restitutive force of the steel frame 12. At this time, the tensile force to be applied to the grid element 2 is set to a tensile force of a level such that any slack would not occur at the slit portions even if a certain extent of thermal expansion is caused at the expansion-type shadow mask when the thus manufactured expansion-type shadow mask is actually used and operated in the Braun tube.

Accordingly, the degree of the thermal expansion of the grid element is made to be small in the present invention, so that the grid element is not required to be fixed with an excessively high tensile force. Therefore, the pressing force to be applied to the steel frame 12 can be effectively reduced in comparison with the conventional grid element using low-carbon steel.

Thereafter, the grid element is subjected to a heat treatment and a surface-blackening treatment in which the grid element is heated in an oxidizing atmosphere to a temperature of 450–700° C. for 5–30 minutes to thereby manufacture an expansion-type shadow mask. The surface-blackening treatment is conducted for the purpose of preventing the generation of secondary electron, heat-radiation, rust or the like, and particularly, improving the effect of increasing corrosion resistance of the shadow mask.

Next, other components or elements to be contained in the iron-based alloy will be explained hereunder.

The iron-based alloy may contain unavoidable impurities that are mixed into the alloy during the manufacturing processes. Furthermore, as far as the contents of the components are within the range capable of achieving the object of the present invention, other components or elements such as silicon, manganese, phosphorus, sulfur, chromium or the like may be appropriately contained in the iron-based alloy for the purpose of exhibiting peculiar properties such as deoxidizing function, forging property or the like at the time of manufacturing the alloy.

Normally, an example of the alloy composition may include a composition containing 0.30% or less of silicon, 0.60% or less of manganese, 0.020% or less of phosphorus, 0.020% or less of sulfur, and balance of iron and unavoidable impurities. However, the composition of the iron-based alloy is not limited thereto.

Silicon exists in the iron-based alloy as silicate type inclusions such as $MnO-SiO_2$, $MnO-FeO-SiO_2$ or the like. When the silicon content exceeds 0.30%, there may be a fear that the etching property would be obstructed due to the existing of the silicate type inclusions. Accordingly, the silicon content is preferably set to 0.30% or less.

Manganese is added to the iron-based alloy for the purpose of exhibiting a deoxidizing function and preventing a hot-brittleness (hot-fragility) at the processes of manufacturing the iron-based alloy. When the manganese content exceeds 0.60%, there may cause a case where the object of the present invention, particularly, the object of preventing the hot-brittleness cannot be achieved. Accordingly, the manganese content is preferably set to 0.60% or less.

When a content of phosphorus exceeds 0.020%, the iron-based alloy is disadvantageously hardened, thereby deteriorating the rolling property. Accordingly, the phosphorus content is preferably set to 0.020% or less.

Sulfur exists in the iron-based alloy as sulfide type inclusions. When the sulfur content exceeds 0.020%, there may cause a fear that the etching property would be obstructed at the manufacturing process of the expansion type shadow mask due to the existing of the sulfide type inclusions. Accordingly, the sulfur content is preferably set to 0.020% or less.

EXAMPLES AND COMPARATIVE EXAMPLES

Hereunder, the present invention will be explained more concretely with reference to the following Examples and Comparative Examples.

Example 1

An iron-based alloy plate having a thickness of 0.1 mm was prepared from a material A having a composition shown in the following Table 1. Then, a water-soluble casein photo-resist was coated on both surfaces of the iron-based alloy plate, the coated resist was dried to form resist films.

Thereafter, the resist films formed to both the surfaces of the iron-based alloy plate were exposed so as to perform patterning by using a pair of glass photographic dry plates which are masks having a predetermined slit-pattern for forming the pattern to the iron-based alloy. Subsequently, the patterned iron-based alloy was subjected to a hardening treatment and a baking treatment. Then, ferric chloride solution as an etching solution having a temperature of 60° C. and a specific gravity of 48° Be (heavy-Baume degree) was sprayed from a nozzle on the patterned resist films formed to both the surfaces of the iron-based alloy plate so as to conduct the etching work to the alloy plate to form a predetermined slit pattern.

After washing the etched plate, the residual resist films were removed and removed by an alkaline solution, thereafter, washed and dried to prepare a grid element which was a plate member for an expansion-type shadow mask. The grid element was manufactured to be a product having a transmission ratio of 19.0%. The quality and characteristics of the thus obtained grid element were evaluated in accordance with the following methods. The results are shown in the following Table 2.

Subsequently, the expansion-type shadow masks were manufactured in accordance with the following procedure. As shown in FIG. 2, the thus obtained grid element 2 was welded and fixed to a steel frame 12 at upper and lower portions thereof under a state that the steel frame 12 was applied with a pressing force in a direction F reverse to an expanding direction Y of the grid element 2. Thereafter, the pressing force is released. Further, the welded grid element was subjected to a surface-blackening treatment by being heated in an atmosphere to a temperature of 670° C. for 30 minutes, thus preparing an expansion-type shadow mask 1. The thus obtained expansion-type shadow mask was evaluated in accordance with the methods described hereinlater. The results are shown in the following Table 2.

Example 2 and Comparative Examples 1 and 2

Iron-based alloy plates each having a thickness of 0.1 mm were prepared from materials B–D having compositions shown in the Table 1. Then, each of the iron-based alloy plates was subjected to the etching treatment in the same manner as in Example 1 thereby to form the respective grid elements that were plate members for the respective expansion-type shadow masks. The grid elements were also manufactured as products each having a transmission ratio of 19.0%.

The shadow mask of Example 2 was manufactured from the material B while the shadow masks of Comparative Examples 1 and 2 were manufactured from the materials C–D, respectively. The quality and characteristics of the thus obtained respective grid elements and the expansion-type shadow masks were also evaluated in the same manner as in Example 1. The results are shown in the Table 2.

Further, it is to be noted that since the shadow mask of Comparative Example 1 was manufactured by using the conventional low-carbon steel plate having a composition with a low recrystallizing temperature, the surface-blackening treatment was performed in atmosphere at a temperature of 460° C. for 15 minutes, the treatment had been usually performed for the conventional low-carbon steel plate.

TABLE 1

| Material | C | Ni | Co | Si | Mn | P | S | Bal. |
|---|---|---|---|---|---|---|---|---|
| A (Example) | 0.051 | 32.0 | 5.0 | 0.01 | 0.25 | 0.006 | 0.008 | Fe, Impurities |
| B (Example) | 0.010 | 32.0 | 5.0 | 0.01 | 0.25 | 0.006 | 0.007 | Fe, Impurities |
| C (Comparative Example) | 0.002 | — | — | 0.01 | 0.20 | 0.015 | 0.007 | Fe, Impurities |
| D (Comparative Example) | 0.003 | 32.0 | 5.0 | 0.01 | 0.25 | 0.006 | 0.008 | Fe, Impurities |

TABLE 2

| | Grid Raw Material | | | | Expansion-Type Shadow Mask | | |
|---|---|---|---|---|---|---|---|
| | Tensile Strength (N/mm$^2$) | Thermal Expansion Coefficient ($10^6$/° C.) | Recrystallizing Temperature (° C.) | Coercive Force (A/m) | Transmission ratio (%) | Scattering ($\mu$m) | Non-uniformity |
| Example 1 | 955 | 2.0 | 750 | 90 | 19.0 | 0.51 | ○ |
| Example 2 | 650 | 1.5 | 750 | 75 | 19.0 | 0.52 | ○ |

TABLE 2-continued

| | Grid Raw Material | | | | Expansion-Type Shadow Mask | | |
|---|---|---|---|---|---|---|---|
| | Tensile Strength (N/mm²) | Thermal Expansion Coefficient (10⁶/° C.) | Recrystallizing Temperature (° C.) | Coercive Force (A/m) | Transmission ratio (%) | Scattering (μm) | Non-uniformity |
| Comparative Example 1 | 850 | 12.5 | 550 | 130 | 19.0 | 0.56 | ○ |
| Comparative Example 2 | 620 | 0.8 | 700 | 68 | 18.9 | 0.52 | ○ |

Examples 3–5 and Comparative Examples 3 and 4

Iron-based alloy plates each having a thickness of 0.1 mm were prepared from materials E–I having compositions shown in the following Table 3. Then, each of the iron-based alloy plates was subjected to the etching treatment in the same manner as in Example 1 to form the respective grid elements that were plate members for the respective expansion-type shadow masks. The grid elements were also manufactured as products each having a transmission ratio of 19.0% and products each having a transmission ratio of 21.0% respectively.

The shadow masks of Examples 3–5 were manufactured from the materials E–G respectively, while the shadow masks of Comparative Examples 3 and 4 were manufactured from the materials H–I, respectively. The quality and characteristics of the thus obtained respective grid elements and the expansion-type shadow masks were also evaluated in the same manner as in Example 1. The results are shown in the following Table 4.

Further, it is to be noted that since the shadow mask of Comparative Example 3 was manufactured by using the conventional low-carbon steel plate having a composition with a low recrystallizing temperature, the surface-blackening treatment was performed in atmosphere at a temperature of 460° C. for 15 minutes, such treatment had been usually performed for the conventional low-carbon steel plate.

(Measuring Methods)

The tensile strength was measured on the basis of a metal material testing method prescribed in JIS (Japanese Industrial Standard) Z2241 in which each of the alloy samples cut out from the respective grid elements was worked into a No.5 test-piece as prescribed in JIS Z2201.

A coercive force was measured in such a manner that each of the alloy samples cut out from the grid elements was subjected to the surface-blackening treatment in which the alloy samples were heated in atmosphere to a temperature of 670° C. for 30 minutes, the conditions of the surface-blackening treatment for the samples were the same as those for manufacturing the expansion-type shadow mask, and the coercive force of each of the blackened samples was measured in accordance with a method prescribed in JIS C2531.

A quality of the respective expansion-type shadow masks were evaluated as follows. In this connection, since a state of non-uniformity or unevenness appearing on the Braun tube varies in accordance with an amount of transmitted light (transmission ratio), it is difficult to correctly judge the quality of the expansion-type shadow mask on the basis of only a scattering dimension in the slit width.

Therefore, in the embodiments of the present invention, a critical value at which the non-uniformity was not observed through a visual check on the Braun tube was specified as an upper limit value of the scattering in the width of the slits, and the non-uniformity was evaluated by the upper limit value of the scattering in the width of the slits.

As the upper limit value of the scattering in the width of the slits, an allowable upper limit was set to 0.90 μm for a

TABLE 3

| Material | C | Ni | Co | Si | Mn | P | S | Bal. |
|---|---|---|---|---|---|---|---|---|
| E (Example) | 0.015 | 32.0 | 5.0 | 0.01 | 0.25 | 0.005 | 0.008 | Fe, Impurities |
| F (Example) | 0.049 | 32.0 | 4.0 | 0.01 | 0.25 | 0.005 | 0.008 | Fe, Impurities |
| G (Example) | 0.090 | 32.1 | 5.0 | 0.01 | 0.25 | 0.005 | 0.008 | Fe, Impurities |
| H (Comparative Example) | 0.003 | 32.0 | 5.0 | 0.01 | 0.27 | 0.005 | 0.008 | Fe, Impurities |
| I (Comparative Example) | 0.117 | 32.1 | 4.0 | 0.01 | 0.25 | 0.005 | 0.008 | Fe, Impurities |

TABLE 4

| | Grid Raw Material | | | Expansion-Type Shadow Mask | | | | | |
|---|---|---|---|---|---|---|---|---|---|
| | Tensile Strength (N/mm²) | Thermal Expansion Coefficient (10⁻⁶/° C.) | Coercive Force (A/m) | Transmission ratio (%) | Scattering (μm) | Non-uniformity | Transmission ratio (%) | Scattering (μm) | Non-uniformity |
| Example 3 | 650 | 1.5 | 75 | 21.0 | 0.56 | ○ | 19.0 | 0.56 | ○ |
| Example 4 | 940 | 2.0 | 90 | 21.0 | 0.60 | ○ | 19.0 | 0.61 | ○ |
| Example 5 | 955 | 2.5 | 92 | 21.0 | 0.81 | ○ | 19.0 | 0.80 | ○ |
| Comparative Example 3 | 610 | 0.8 | 69 | 21.0 | 0.54 | ○ | 19.0 | 0.55 | ○ |
| Comparative Example 4 | 1000 | 3.0 | 98 | 21.1 | 0.95 | X | 19.0 | 0.95 | X | product having a transmission ratio of 21.0% while an allowable upper limit was set to 0.80 μm for a product having a transmission ratio of 19.0%. At this time, when the product having the transmission ratio of 21.0% is compared with another product having the transmission ratio of 19.0%, the non-uniformity appearing on Braun tube using the product having the larger transmission ratio of 21.0% becomes small, so that the upper limit value of the scattering becomes slightly larger than that of the product having the transmission ratio of 19.0%. The scattering was evaluated by indicating symbols of ○, Δ and X. The symbol ○ denotes a high-grade product in which the scattering was less than the allowable upper limit. The symbol Δ denotes an available product in which the scattering was equal to the allowable upper limit. The symbol X denotes a defective product in which the scattering exceeds the allowable upper limit.

The scattering in the width of slits was evaluated as follows. Namely, the expansion-type shadow mask controlled to have the same transmission ratio as that of a mask for forming a slit-pattern was used, the width of the resulting slit was measured with respect to each of 25 lines of adjacent slits, and a maximum difference was calculated from the respective slit-widths. The scattering in the width of slits was evaluated by the maximum difference.

(Results)

As is clear from the results shown in Tables 2 and 4, each of Examples 1–5 had a small thermal expansion coefficient and a high tensile strength, so that there could be obtained an expansion-type shadow mask having excellent characteristics.

On the other hand, Comparative Example 1 had a large tensile strength while having a disadvantage of exhibiting a large thermal expansion coefficient. Each of Comparative Examples 2 and 3 had a small thermal expansion coefficient while having a disadvantage of exhibiting a low tensile strength. Comparative Example 4 had a large tensile strength while having disadvantages of exhibiting a large thermal expansion coefficient and non-uniformity.

Furthermore, each of the shadow masks of Examples 1–5 has a magnetic property almost equal to those of Comparative Examples 1 and 3 using the conventional low-carbon steels, Examples 1–5 can exhibit a required and sufficient magnetic shielding effect. In addition, the recrystallizing temperatures of the shadow masks of Examples 1–5 are high, so that the surface-blackening treatment can be performed at a high temperature, thus being advantageous.

As described above, according to Examples of the present invention, the expansion-type shadow mask manufactured by using the iron-based alloy hardly causes a thermal expansion even if the heat generation is caused based on the collision of the electron beam, so that the shadow mask is no need to be expanded and fixed by being applied with an excessively high tensile force at the assembling process for the shadow mask.

In addition, the thus manufactured expansion-type shadow mask hardly cause a slack at the slit portions due to the thermal expansion and hardly cause any disturbances of slit-interval. Furthermore, since a tensile strength of the iron-based alloy can be increased in comparison with an iron-based alloy containing no carbon, even if the thermal expansion is actually caused, it becomes possible to perform the expanding and fixing working with a high tensile force of a level without causing any slacks at the slit portions.

According to another aspect of the present invention in which the tensile strength is appropriately specified, the expanding/fixing working for the shadow mask can be easily and appropriately performed by applying a high tensile force at the manufacturing process of the expansion-type shadow mask. As a result, even if the thermal expansion slightly occurs due to the heat generation caused by the collision of the electron beam, the slacks would not occur at the slit portions of the thus obtained expansion-type shadow mask, so that the disturbance of the slit-interval can be effectively prevented.

Thus, the expansion-type shadow mask according to the present invention hardly causes a color-mismatching on a reproduced image in the Braun tube. Further, the recrystallizing temperature of the iron-based alloy is high, so that the surface-blackening treatment can be performed at a high temperature so as to further improve the corrosion resistance of the shadow mask.

It is to be noted that the present invention is not limited to the described embodiments and many other changes and modifications may be made within the scope of the appended claims.

What is claimed is:

1. A shadow mask comprising a frame member, a mask body formed in a plate shape as a grid element having a plurality of slits and mounted to the frame member, wherein the mask body is composed of an iron-based alloy containing nickel of 32.0 to 34.0 weight %, cobalt of 3.5 to 6.5 weight %, carbon of 0.02 to 0.07 weight % and unavoidable impurities and iron in an amount of balance, and said iron-based alloy has a tensile strength of 650 to 1,000 N/mm$^2$.

* * * * *